United States Patent
Crane et al.

(10) Patent No.: US 9,349,790 B2
(45) Date of Patent: May 24, 2016

(54) POWER ELECTRONIC DEVICES

(75) Inventors: Allan David Crane, Gywnedd (GB); Sean Joseph Loddick, Warwickshire (GB); David Hinchley, Leicestershire (GB)

(73) Assignee: GE Energy Power Conversion Technology Ltd., Warwickshire (GB)

( * ) Notice: Subject to any disclaimer, the term of this patent is extended or adjusted under 35 U.S.C. 154(b) by 236 days.

(21) Appl. No.: 13/882,621

(22) PCT Filed: Oct. 26, 2011

(86) PCT No.: PCT/EP2011/005387
§ 371 (c)(1),
(2), (4) Date: Aug. 23, 2013

(87) PCT Pub. No.: WO2012/059193
PCT Pub. Date: May 10, 2012

(65) Prior Publication Data
US 2013/0321034 A1    Dec. 5, 2013

(30) Foreign Application Priority Data
Nov. 2, 2010   (EP) .................................... 10014222

(51) Int. Cl.
*H01L 23/367*   (2006.01)
*H01C 7/12*   (2006.01)
(Continued)

(52) U.S. Cl.
CPC .......... *H01L 29/0607* (2013.01); *H01L 23/051* (2013.01); *H01L 23/3185* (2013.01); *H01L 23/60* (2013.01); *H01L 24/06* (2013.01); *H01L 24/72* (2013.01); *H01L 25/117* (2013.01); *H01L 29/0661* (2013.01); *H01L 29/12* (2013.01); *H03K 17/56* (2013.01); *H01L 24/48* (2013.01);
(Continued)

(58) Field of Classification Search
CPC .. H01L 29/0607; H01L 23/051; H01L 23/367
USPC ...................... 257/76, 635, 707, E23.08, 688; 361/111; 437/208
See application file for complete search history.

(56) References Cited

U.S. PATENT DOCUMENTS

| 3,441,814 A | 4/1969 | Steinmetz |
| 3,532,942 A | 10/1970 | Boyer |

(Continued)

FOREIGN PATENT DOCUMENTS

| EP | 0788169 A2 | 8/1997 |
| EP | 2161746 A1 | 3/2010 |

(Continued)

*Primary Examiner* — Kenneth Parker
*Assistant Examiner* — Young W Kim
(74) *Attorney, Agent, or Firm* — Wood IP LLC

(57) ABSTRACT

A semiconductor device or power electronic device is described. The device includes a pair of pole pieces, each having a profiled surface. A semiconductor body or wafer, preferably of wide bandgap electronic material, is located between the pole pieces and includes contact metallization regions. The semiconductor body produces an electric field that emerges from an edge region. Passivation means includes a first or radially inner part in contact with the edge region of the semiconductor body and which diffuses the electric field as it emerges from the edge region and a second or radially outer part. The second part of the passivation is in contact with the first part and provides a substantially void-free interface with the profiled surface of each pole piece. The device may be immersed in a dielectric liquid.

22 Claims, 9 Drawing Sheets

(51) Int. Cl.
  *H03K 17/687* (2006.01)
  *H01L 29/06* (2006.01)
  *H01L 23/051* (2006.01)
  *H01L 23/31* (2006.01)
  *H01L 23/60* (2006.01)
  *H01L 23/00* (2006.01)
  *H01L 25/11* (2006.01)
  *H01L 29/12* (2006.01)
  *H03K 17/56* (2006.01)

(52) U.S. Cl.
  CPC ... *H01L 29/0619* (2013.01); *H01L 2224/04042* (2013.01); *H01L 2224/06181* (2013.01); *H01L 2224/4847* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01); *H01L 2924/01082* (2013.01); *H01L 2924/10156* (2013.01); *H01L 2924/1301* (2013.01); *H01L 2924/1305* (2013.01); *H01L 2924/13055* (2013.01); *H01L 2924/30107* (2013.01)

(56) References Cited

U.S. PATENT DOCUMENTS

| | | | |
|---|---|---|---|
| 3,736,474 A | | 5/1973 | Sias |
| 4,196,442 A | | 4/1980 | Arakawa |
| 4,388,635 A | | 6/1983 | Watanabe |
| 4,775,916 A | | 10/1988 | Kouzuchi |
| 5,422,779 A | * | 6/1995 | Borkowicz ............... H01C 7/12 257/E23.187 |
| 5,489,802 A | | 2/1996 | Sakamoto |
| 5,519,231 A | | 5/1996 | Nakashima |
| 5,543,363 A | * | 8/1996 | Tokunoh ............... H01L 23/051 257/688 |
| 2010/0059878 A1 | * | 3/2010 | Crane ................... H01L 23/367 257/707 |
| 2010/0271081 A1 | * | 10/2010 | Caiafa ................. H03K 17/687 327/109 |

FOREIGN PATENT DOCUMENTS

| GB | 1358504 A | 7/1974 |
|---|---|---|
| JP | 1152668 A | 6/1989 |
| JP | 8-222724 A | 8/1996 |
| JP | 8-330337 A | 12/1996 |
| JP | 2005072351 A | 3/2005 |

* cited by examiner

POWER ELECTRONIC DEVICES

FIELD OF THE INVENTION

The present invention relates to power electronic devices, and in particular to those that employ wide bandgap electronic materials such as diamond and silicon carbide.

BACKGROUND OF THE INVENTION

EP 2161745 discloses a stack assembly where semiconductor devices are interspersed and compressed between heatsinks. The semiconductor devices have an "open" construction and are not hermetically sealed in a housing. It is believed that semiconductors devices having an "open" construction will benefit most from being immersed in a dielectric liquid. This is because any spaces or gaps between the various component parts of the semiconductor device will be flooded with the dielectric liquid to provide a suitable dielectric environment. The materials used in the semiconductor device must be chemically, structurally and dielectrically compatible with the dielectric liquid so that neither the semiconductor device nor the dielectric liquid are degraded as a result of their contact. It will be readily appreciated that such a semiconductor device is differentiated from one having a conventional press pack construction with a hermetically sealed housing which allows all regions of the semiconductor body to be surrounded and permeated by a suitable moderately pressurised dielectric gas, e.g. dry nitrogen. The semiconductor device also lacks the copper pole pieces that are associated with conventional press pack semiconductor devices. The copper pole pieces are effectively replaced by the heatsinks. The conventional enclosure parts would normally account for about half of the total cost of the conventional press pack semiconductor device. The lack of conventional enclosure parts in a semiconductor device having an "open" construction therefore provides significant cost benefits.

Each semiconductor device comprises a semiconductor body which is encapsulated within a compliant outer ring. The semiconductor body is sandwiched between cathode and anode plates. The outer ring limits the ingress of pollutants into the semiconductor device whilst in storage or when assembled within the stack assembly and protects the semiconductor device against impact or shock during mechanical handling. An important limitation of the semiconductor devices disclosed in EP 2161745 is that the semiconductor bodies have exactly the same construction is those used in industry standard press pack housed arrangement, i.e. they have no features that would enhance voltage breakdown capability or the ratio of effective current carrying area per total area of the semiconductor body. Nor do they exploit the outer ring that surrounds the semiconductor body to provide any dielectric benefit that is specific to higher voltage or wide bandgap power electronic devices.

Emerging wide bandgap electronic materials, for example diamond and silicon carbide, in conjunction with associated processing and fabrication techniques, will allow power electronic devices to block far greater voltages that are currently possible using silicon. However, current field termination and packaging methods will limit the voltage blocking capability, or at least serious limit the effectiveness of improved power electronic devices that employ these new electronic materials. Any references herein to particular electronic or semiconductor materials will be equally applicable to both power semiconductor and other power electronic devices.

A conventional press pack construction has a hermetically sealed housing which is backfilled with a stable dielectric gas such as dry nitrogen. The dielectric gas fills the space around the semiconductor body and is therefore exposed to a significant electric field as it emerges from the body. It is also necessary for the dielectric gas to be chemically compatible with the materials that are employed in the semiconductor device and this precludes the use of many gasses that would otherwise have beneficial properties. In practice the design of the semiconductor body must include features that diffuse the electric field as it emerges from the body to the point where surface breakdown is improbable, taking into account the relatively low breakdown strength of the dielectric gas. The techniques by which the internal electric field of the semiconductor body may be diffused are well known and may be broadly described as: (a) bevelling, (b) doping profiling, (c) the insertion of field control electrodes, and (d) surface passivation. Techniques (b) and (c) are also known as planar edge termination features. These are further described with reference to x and y axes of the semiconductor device where the x axis is projected radially outwards from the centre of the device and the y axis is projected through the axial thickness of the body.

Bevelling:

Bevelling is a geometric feature where the internal electric field is resolved into x and y axis components as it intercepts a conically ground or etched surface. The flatter the conical surface of the bevel the greater the attenuation of surface electric field. Conversely, the more cylindrical the surface of the bevel the lower the attenuation of the surface electric field. The attenuation follows a simple trigonometric relationship in the ideal case where a constant y axis field is present in the semiconductor body. Simple, compound, moat groove and pulley wheel structures are employed and these may be combined with doping profiling. In practice, the doping profile of the semiconductor device has a great impact on bevel performance characteristics.

Doping Profiling:

The doping (i.e. the process of intentionally introducing dopants or impurities into the semiconductor body to change its electrical properties) of the semiconductor body is inherently profiled in the y axis and is usually profiled in the x axis, the latter causing the electric field to be curved as it exits the semiconductor body. Doping profiling is also commonly known as doping contouring. This method may be extended to produce field control electrodes which may be diffused or otherwise implanted within the semiconductor body.

Field Control Electrodes:

Field control electrodes, e.g. guard rings, are implanted or deposited around the periphery of the semiconductor body in order to modify the electric field distribution in the x axis. These electrodes may be conductive, resistive or semiconducting in construction. A number of such features may be employed and the x axis distribution of the electric field is subject to a corresponding number of discontinuities. The intensity of the discontinuities is dependent upon the resolution of the optical process that is employed in the production of the field control electrodes and the nature of the material within the field control electrodes themselves.

Occasionally a derivative of this field control means is employed wherein a field control plate is located around the periphery of the semiconductor body, the surface of the field control plate being parallel to, and spaced apart from, the surface of the semiconductor body and electrically isolated from the surface of the semiconductor body by an insulation medium upon which the field control plate is typically produced by a metallic deposition process. This method is not normally preferred for high voltage devices as a result of the difficulty in controlling the thickness of the insulation medium upon which the field control plate is deposited and, moreover, as a result of electric field concentration resulting from the stepped nature of the field control plate.

Surface Passivation:

Whatever combination of the above techniques is employed, it is generally a requirement that the surface of the semiconductor body outside the metallised contact area is passivated by growing or depositing a dielectric coating upon the otherwise exposed semiconductor structure. The passivation performs two functions: it renders the semiconductor materials substantially insensitive to external sources of ionic pollutants, and it allows the electric field to be further diffused as it exits the semiconductor materials within the semiconductor body according to well known resistive and dielectric principles.

An example of a moat groove bevel, a conical bevel and a pulley wheel bevel are shown in FIGS. 1, 2 and 3, respectively. In each case a semiconductor device includes a semiconductor body 2 with contact metallisation 4, 6 and some form of passivation 8

The ideal form of resolving the internal electric field of the semiconductor body 2 is shown in FIG. 2 where a voltage component Vy within the y axis electric field within the semiconductor body intercepts a bevel surface 10 to give a voltage component Vx aligned with the x axis and which is impressed upon the bevel surface. In this case, the bevel surface voltage gradient is similar to that of Vx in the x axis because the bevel is nearly flat. In the conical bevel shown in FIG. 2 the electric field is also slightly further diffused by the passivation (which is represented by the cross-hatched regions 8) and the associated voltage component at the external surface of the passivation Vp is slightly lower than Vx. In some cases, the passivation 8 may be designed to diffuse the electric field more than in the example shown in FIG. 2 but significant space is occupied by passivation as a result of the limitation of the surface breakdown voltage gradient of the passivation surface in a dry dielectric gas.

The practical limitation of such passivation when used in silicon power semiconductor devices is not evident from FIGS. 1 to 3 because they have not been drawn to scale for reasons of clarity, but the skilled person will be aware that in practical implementation of the pulley wheel bevel shown in FIG. 3 where the semiconductor device has a 6 kV blocking voltage rating, for example, then the axial (or y axis) thickness of the passivation ring 8 will typically be in the region of 5-8 times the axial thickness of the semiconductor body 2 that it surrounds. It will also be noted that the radial thickness of the passivation ring 8 will typically be in the region of 6-10 times the axial (or y axis) thickness of the semiconductor body 2. FIGS. 1 to 3 show passivation rings 8 whose y/x aspect ratio is greater than in reality as a result of having exaggerated the thickness of the semiconductor body 2 in order to make the bevel 10 and corresponding voltage Vy of FIG. 2 legible. When shown to a correct scale, the thickness of the semiconductor body 2 would be a factor of about ten times smaller whereas the axial and radial projections of the passivation rings 8 beyond the surfaces of the semiconductor body would be approximately correct. Also for reasons of clarity the depth of the pulley wheel groove shown in FIG. 3 is approximately correct in relation to the thickness of the semiconductor body 2. The principal advantage that is cited for the example of the pulley wheel bevel that is shown in FIG. 3 is that the contact metallisation areas 4, 6 may closely approach the inside diameter of the passivation ring 8 because the majority of the electric field exits the passivation ring from its outer cylindrical surface, thereby maximising effective current carrying area. Nevertheless, significant housing space is still occupied by the passivation ring 8 and the surrounding gas space. The pulley wheel bevel structure is not applicable to wide bandgap devices because passivation materials that are suitable for use at the limiting electric field strength of the semiconductor or other power electronic devices do not exist, nor are they likely to exist, nor could an effective interface be developed between passivation and electronic materials. A very high performance semiconductor device could be made using a thin wafer of diamond and a pulley wheel bevel passivation material would not be viable unless its breakdown strength was far in excess of that of diamond. It therefore follows that planar edge termination methods are preferred in projected high voltage and wide bandgap devices.

FIG. 4 shows a common planar edge termination technique wherein a number of concentric guard rings 12 or field control electrodes effectively locally short out the x axis component of the electric field as it emerges from the semiconductor body 2. When fine guard ring structures are employed, the thickness requirement for the associated passivation 8 is minimised. It will be readily appreciated that the passivation 8 effectively provides an averaging function for the discontinuous nature of field diffusion provided by multiple guard rings 12. Such guard rings 12 are applied to only one face of the semiconductor body 2, the contact metallisation 6 on the other face of the semiconductor body being extended radially outwards to the same extent as the outermost guard ring.

All of these field diffusion techniques inherently require a proportion of the surface of the semiconductor body 2 to be occupied by geometric features that are outside the effective current carrying area of the semiconductor body, i.e., outside its electrical contact metallisation 4. It follows that the greater the voltage withstand rating of a semiconductor device, the lower the effective current carrying area becomes as a proportion of total area of the semiconductor body 2 and this is a serious impediment to wide bandgap devices that employ present day field control methods.

It is conventional practice to incorporate shedding on the insulation surface of a press pack housing in order to minimise the risk of surface breakdown at its interface with the surrounding air environment. Even when shedding includes long creepage distances and reasonable measures are taken to maintain the surrounding air in a clean, dry state, the risk of surface breakdown is significant. In practice the shedding features are sufficient to allow surface breakdown or tracking to be avoided under ideal conditions, but maintenance deficiencies and abnormal operating conditions that result in surface particulate deposits or condensation being on or even bridging the shedding may lead to breakdown. The space that is occupied by such air insulation systems must have a significant impact upon total equipment power density if this risk is to be mitigated.

It is also known for passivated die-type semiconductor devices with the above moat groove type bevel and ring type field control electrodes to be used in power modules wherein the die is mounted on an insulation material substrate by any suitable means, connected to internal busbars by any suitable means and is encapsulated in a dielectric gel before the power module is permanently sealed within a plastic housing. Moreover, it is known that the dielectric gel supplements the passivation in order to allow the complete power module to attain a breakdown voltage capability that is at least equal to that of the internal capability of the die. Despite the benefit provided by the dielectric gel, such gels have limited ability to enhance breakdown voltage beyond 6.5 kV, even when a precisely controlled vacuum impregnation process is employed. For example, FIG. 5 shows an IGBT die structure having a blocking voltage rating of 3 kV and above. A significant proportion of die area 20 is occupied by passivated guard rings 22 and a sophisticated vacuum impregnation process is required in order for the dielectric gel 24 to provide effective voltage breakdown protection. Gel insulation systems have progressively less insulation performance, and more particularly partial discharge inception performance, as device blocking voltage rating is increased beyond say 4.5 kV. The effective current carrying area of 6.5 kV IGBT die is seriously compromised by gel insulation system performance limitations.

As semiconductor or other power electronic device body internal voltage breakdown capability continues to increase, the requirement to control electric field strength will become increasingly important and present day insulation and packaging systems will seriously compromise the potential benefits that are offered by wide bandgap electronic materials. This issue will be further exacerbated as newly introduced wide bandgap electronic materials and processing techniques permit thinner semiconductor bodies to be employed, thereby tending to concentrate the un-mitigated electric field at the edges of the contact metallisation regions. In practice, the thinner a semiconductor body is, the less effective bevelling is and the above-described planar edge termination methods must be employed in high performance wide bandgap devices. Passivation is an almost mandatory requirement and is able to supplement any form of edge termination for field diffusion purposes. Voltage breakdown and edge termination are very complex subjects and a detailed description can be found in Chapter 3 of "Fundamentals of Power Semiconductor Devices", B. Jayant Baliga, ISBN-10: 0387473130, ISBN-13: 978-0387473130.

SUMMARY OF THE INVENTION

The present invention provides a high voltage device immersed in a liquid dielectric, the device comprising: a pair of pole pieces; a device body located between the pole pieces, the device body being subjected to an electric field and having a central current carrying region and an edge termination region that includes planar edge termination features (e.g. field control electrodes or rings) to diffuse the electric field within the device body, the electric field emerging from the edge termination region of the device body; and passivation means having a first (or radially inner) part in contact with the edge termination region of the device body and which diffuses the electric field as it emerges from the edge termination region and a second (or radially outer) part which provides an interface with the profiled surface of each pole piece and which further diffuses the electric field as it emerges from the first part of the passivation means, a radially outer surface of the second part of the passivation means being in contact with the dielectric liquid; wherein each pole piece has a profiled surface at a peripheral edge region to control the diffusion of the electric field within the passivation means.

The device may be a semiconductor device with a whole wafer semiconductor body such as a thyristor, gate turn-off thyristor (GTO), gate commutated thyristor or gate controlled thyristor (GCT), a derivative of these devices (e.g. a dual gated thyristor), or diode. The device may be a die-based semiconductor device such as an insulated-gate bipolar transistor (IGBT). The device may be a power electronic device with a suitable device body that employs majority carrier or minority carrier type semiconductors, a non-semiconductor power electronic device having two power terminals and optionally at least one control terminal, or an insulator having two power terminals. The present invention relates to high voltage devices, for example, semiconductor or power electronic devices that operate at voltages greater than about 4.5 kV and perhaps up to about 100 kV. It is expected that a typical practical device may operate at a voltage of between about 6 and about 25 kV. It will be readily appreciated that such high voltage devices have significant electric fields that must be diffused using the combination of planar edge termination features (other field termination techniques such as bevelling being considered suitable only for devices operating at lower voltages), the passivation means, and the profiled surfaces of the pole pieces which typically remain in close proximity to the planar edge termination features and can therefore control the field distribution within the passivation means.

A first layer of passivation material may define the first part of the passivation means and a second layer of passivation material may define the second part of the passivation means. The first part of the passivation means may be formed as an integral part of the device body, e.g. during processing of the device body. The second part of the passivation means may be formed around the first part or around the integral first part and device body. The first and second parts of the passivation means may optionally be integrally formed or separately formed (e.g. in completely separate manufacturing processes). If the first and second parts of the passivation means are separately formed then the second part may be joined, bonded or otherwise secured to the external surface of the first part, assembled around the first part, or grown or deposited on the external surface of the first part.

The purpose of the first part (or layer) of the passivation means is to chemically stabilise the exposed surfaces of the device body rendering them insensitive to the presence of ionic pollutants that may surround the device body and to diffuse the electric field in a controlled manner to the point where electrical breakdown at the surface of the device body or within the passivation means is improbable or can be prevented.

The first part of the passivation means is preferably formed from a substantially rigid, dense, void-free, chemically stable, dimensionally stable material that is capable of achieving a high integrity bond to the electronic material of the device body as a result of the need for long term dielectric performance. For example, the first part of the passivation means may be formed from a glassy material, a ceramic material, a crystalline material, an oxide material or a rigid resin material such as polyimide or polyamide which would be expected to have good long term performance. If the second part (or layer) of the passivation means is capable of absorbing any surrounding dielectric liquid then the first part of the passivation means may be exposed to the dielectric liquid and any ionic pollutants that it may carry. It is also possible that the second part of the passivation means may itself contain ionic pollutants that are sufficiently mobile to come into contact with the first part of the passivation means. In such cases, the first part of the passivation means is preferably capable of providing a stable barrier that protects the device body from the effects of the ionic pollutants. The use of a first part of the passivation means is conventional within the semiconductor industry and any suitable material and process may be used. Furthermore, the design and processing of the first part of the passivation means may be considered to be an integral part of the design and processing of the device body, and that the design and processing of the device body may incorporate the positioning of the planar edge termination features, for example a plurality of field control rings that control the emergence of electric field from the device body and the first part of the passivation means.

The purpose of the second part of the passivation means is to provide a substantially void-free insulator, preferably with precisely known and uniform dielectric properties, that at least partially fills the space between the profiled surfaces of the pole pieces and the external surface of the first part in a way that limits partial discharge activity to such an extent that a long insulation life is achieved.

The pole piece surfaces are profiled (i.e. the facing surfaces are formed to have a desired shape) at a peripheral edge region so as to control the diffusion of the electric field within the passivation means, thereby overcoming the concentration of electric field at the geometric and electrical discontinuity that is present at the edge of the contact metallisation in conventional pressure contact power electronic devices. The profile of the pole piece surfaces is preferably adapted to take into account the topology and characteristics of the device body, the planar edge termination features that are integral features of the device body, and the dielectric properties of the passivation materials. The part of each pole piece that is profiled typically lies radially outside the central region that faces the current carrying region of the device body, i.e. the part of the device body that includes contact metallisation regions. In other words, the pole pieces typically have a central region that is substantially flat and which may be in direct contact with the contact metallisation regions of the device body or in contact with intermediate anode and cathode side discs or plates which are in turn in contact with the contact metallisation regions, and a peripheral edge region which has a desired profile and which defines a substantially void-free interface with the outer surface of the second part of the passivation means. The transition between the central region and the peripheral edge region of the pole pieces may be at a region which faces substantially the radially inner side of the planar edge termination features such as field control rings.

The pole piece surfaces may have the same or different profiles. Put another way, the surface profiles of the two pole pieces may be symmetrical (mirror images) or asymmetrical. The requirement for symmetry, or a particular degree of symmetry, in the surface profiles of the pole pieces is entirely dependent on the topology of the device body. For example, a diode would have only a reverse blocking junction so an asymmetric field shaping geometry could be used. In this case the pole pieces may have different surface profiles at their peripheral edge regions. However, a thyristor may have both forward and reverse blocking junctions with symmetrical capability so a symmetric field shaping geometry could be used. It will be readily appreciated that the magnitude, polarity and location of the electric field, both within the device body and as it emerges from the semiconductor body of a thyristor, are dependent upon whether the device is in the forward blocking or reverse blocking operating mode, i.e. the electric field that emerges from the device body of a thyristor is inherently asymmetrical.

In one aspect then the surface profile of at least one pole piece is curved in a manner that becomes tangential to the outer surface of any adjacent contact metallisation as the surface of the pole piece approaches the substantially flat region of the device body that provides the required pressure contact electrical and thermal interface between the device body contact metallisation and the associated pole piece. The radius of such curvature in this region is typically greater than 2 mm. In another aspect then at least one of the pole pieces may be flat but will remain essentially tangential to the outer surface of any adjacent contact metallisation.

The second part of the passivation means may be formed from a material having a high electrical breakdown strength (e.g. about 20 kV/mm), a uniform and high volume resistivity (e.g. about $1\times10^{14}$ $\Omega\cdot$cm) and a uniform dielectric constant (e.g. about 2.8 between 100 Hz and 100 kHz) that is significantly greater than that of the dry nitrogen that commonly envelops the semiconductor body within a conventional press pack device. A typical tangent of dielectric loss angle would be less than 0.002 at 100 kHz. The distribution of the electric field that emerges from the device body and enters the space between the profiled pole pieces (electrodes) is governed by field theory. Electrode geometry is always important in governing field distribution but the effect of the dielectric between electrodes is frequency dependent. At supply line frequency, and higher frequencies, the dielectric constant behaviour dominates dielectric behaviour and dielectric losses have minimal impact at power system frequencies. At very low frequencies the volume resistivity becomes significant. Put simply, for all practical purposes it is expected that voltage distribution through a dielectric material is capacitively governed except under DC conditions where volume resistivity is significant or when partial discharge or other breakdown mechanisms modify insulation system behaviour. AC and DC field effects are superimposed in practical power circuit applications. The specified progressive separation of the pole piece surface from the device body overcomes the natural tendency for both AC and DC components of electric field to become concentrated in the region at the outer edge of contact metallisation of the device body. By employing finite element analysis of the electric field as part of the design process for such a power electronic device, the peak electric field strength in passivation materials may be set to a sufficiently low level to minimise the dual risks of partial discharge and bulk dielectric breakdown. In practice the peak working electric field strength could be designed to be no greater than about 5-10 kV/mm depending on the efficiency of the vacuum impregnation process and the specification of the impregnant in avoiding the formation of partial discharge sites. An approximate safety factor may be determined by dividing the datasheet electrical breakdown strength of the material forming the second part of the passivation means by the peak working field strength and a safety factor of 2 might be a typical minimum design value.

The second part of the passivation means may be formed from a compliant elastomeric material that is compressed into the space between the pole pieces and the first part, and optionally also between pole pieces themselves. The second part of the passivation means may be compressed into the space in the presence of any suitable gas such as ambient air or dry nitrogen, or liquid. The second part of the passivation means may be designed to initially be compressed only at its radially inner periphery and for the compressed region to progressively expand towards the outer periphery as compression force is applied, thereby extruding the majority of any gas or liquid that would otherwise be trapped between passivation means and the pole pieces. The interface between the external surface of the second part of the passivation means and the profiled surfaces of the pole pieces is preferably substantially void-free. Small gas- or liquid-filled voids may be present at the interface in practice, but partial discharge would not be problematic in such instances because the elastomeric material would, by being compressed against a metal electrode, become coated with electrically conductive arcing by-products in the region of the void. Partial discharge activity is known to be suppressed in such circumstances which increases insulation life expectancy.

The second part of the passivation means is preferably substantially void-free in order to eliminate the risk of potentially damaging partial discharge within the bulk of the elastomeric material. It will be readily appreciated that it is almost impossible to prepare an elastomeric material that contains no voids whatsoever and the term 'substantially void-free' is therefore intended to mean that the bulk of the elastomeric material is substantially free of partial discharge activity or that the level of partial discharge activity is non-damaging. For example, a maximum discharge magnitude of about 10 pC might be generally considered to be non-damaging to uncompressed elastomeric materials and the specific compression is known to be beneficial to the life expectancy of elastomeric materials from a partial discharge perspective. The first part of the passivation means is also preferably substantially void-free for the reasons outlined above. A maximum discharge magnitude of about 10 pC might be generally considered to be non-damaging but for some rigid dielectric materials then maximum discharge magnitudes of about 20 pC, or even 100 pC in the case of high-grade ceramics, might be possible. It is likely that the presence of normally trivial levels of partial discharge, in the context of insulation design, say less than about 3 pC at individual discharge sites, whilst not being damaging to the surrounding dielectric liquid could potentially generate ionic pollutants and such internal pressures as to cause these pollutants to propagate into the device body. In all cases it would be preferred if the chosen materials for the passivation means have a complete and proven absence of partial discharge which may require preliminary testing.

Finally, the second part of the passivation means must be chemically compatible with the dielectric liquid that surrounds the device body in use but it may, in some circumstances, be acceptable for the elastomeric material to expand or for its mechanical properties to be modified as a result of immersion in the surrounding dielectric liquid.

Silicone rubbers are particularly well suited for use as the second part of the passivation means since they can be moulded quite easily, adhere well to typical first part passivation materials, are sufficiently flexible to permit the specific compression without excessive dimensional tolerances and are sufficiently robust to provide mechanical protection of the 'basic units' of pre-manufactured devices (see below). The silicone rubber second part may be moulded by vacuum impregnation of a device body that includes the first part of the passivation means and which is compressed between suitable profiled tooling. The profiling of the tooling must take into account shrinkage of the silicone rubber that occurs during the curing process in order to provide a specific or desired compression when the finished 'basic unit' is compressed between pole pieces. A mould release agent may be applied to the tooling surface to allow removal of the tooling after curing. An o-ring or similar compressible seal may be applied to the tool to eliminate ingress of pre-cured liquid silicone rubber where this would degrade the electrical and thermal contact interface between the contact metallisation of the device body and the associated pole piece. A primer coating may be applied to the exposed surface of the first part of the passivation means in order to improve the integrity of the bond between the first and second parts. As long as the outer exterior surface of the first part of the passivation means is clean then primerless silicone encapsulants such as SYLGUARD 567 (a commercially-available silicone encapsulant supplied by Dow Corning Corporation) may be employed. If a controlled vacuum impregnation process is used then the risk of partial discharge can be minimised and the practical dielectric performance of the impregnant closely approaches the datasheet performance specification and the safety factor mentioned above is sufficient for design purposes.

The second part of the passivation means further diffuses the electric field so that when it emerges from the passivation means and enters the surrounding dielectric liquid then there is no significant risk of electrical discharge. Immersing the device in a suitable dielectric liquid effectively extends the solid state passivated region. The surrounding dielectric liquid may be substantially void-free, but may contain finely entrained dry air or dry gas or the vapour phase of the dielectric liquid which may tend to adhere to the surface of the passivation material. In one aspect then the device is preferably immersed in, and enveloped by, an electrical discharge-free or discharge-tolerant dielectric liquid. The dielectric liquid may be force circulated and continuously out-gassed thereby causing the presence of partial discharge sites that benefit from the flushing action of the dielectric liquid to be a confined to transient phenomenon. The movement of the dielectric liquid past the power electronic device will suppress and flush discharge sites clear of the regions of highest field strength on the outer surface of the passivation means. The profiling of the pole piece surfaces may regulate and enhance the discharge-free environment around the device body. Any suitable dielectric liquid may be employed. It will be readily appreciated that the term 'dielectric liquid' is not just intended to cover proprietary liquids that are specifically marketed as such, but any liquid that has a sufficient dielectric withstand. This would include de-ionised water, FLUORINERT and other equivalent perfluorocarbon fluids, mineral transformer oils, silicone transformer oils, synthetic oils and esters, methylene chloride etc. A particularly preferred dielectric liquid is a proprietary transformer insulating fluid such as MIDEL and its equivalents. The dielectric liquid will be subject to various environmental and chemical compatibility considerations. The surrounding dielectric liquid may be used to cool the device during use.

In practice the passivation means may have any suitable number of parts or layers of passivation material depending on the precise construction and requirements of the device.

The device body defines a central current carrying region and an edge termination region. The current carrying region of the device may have metallised contact surfaces and be compressed between the pole pieces. The edge termination region may include features that are internal and external to the device body. When the device is in the off state the device body will experience extremely high electric field strength between the metallised contacts and the emergence of the intense electric field from between these contacts must be moderated so as to avoid surface discharge. This moderation process is known as edge termination. Any suitable planar edge termination technique or grading may be employed to supplement and enhance the passivation means of the present invention, but the use of field control rings will typically be preferred.

The device body may be made of any suitable electronic material, including wide bandgap electronic materials such as diamond and silicon carbide. Diamond is a wide bandgap electronic material that is not conveniently doped to yield P and N type materials with semiconducting properties. Electronic power devices that employ diamond may therefore use other means than semiconducting behaviour to generate carriers. On the other hand, silicon carbide is a wide bandgap material that can be easily doped to facilitate semiconductor behaviour with electron and hole carriers. The present invention may also be applied to high voltage power semiconductor devices or other electronic power devices that employ semiconductor materials that do not have a wide bandgap such as silicon which lends itself to use in semiconductor power devices that rely on electron and hole carriers.

In the case of an electronic material such as diamond then the device body can be made very thin, e.g. about 100 μm.

Such a device body may be able to withstand the effects of differential thermal expansion across the compressed interfaces as a result of its relatively great strength and flexibility when compared with more commonplace semiconductor materials such as silicon. In the case of thicker semiconductor bodies, or those having poor mechanical performance, it may be necessary to buffer the device body from the pole pieces by using intermediate anode and cathode side discs or plates, these having a significantly lower positive thermal coefficient of expansion than that of the pole pieces. If intermediate discs are employed they are preferably integrated with the desired pole piece surface profile by either being placed within a recess in the corresponding pole piece or by being profiled themselves, as part of the desired overall electrode profile.

The device body may be of the fully-floating type, i.e. the metallised contact surfaces of the device body are not permanently and immovably metallically bonded to the adjacent pole piece or intermediate disc. It is preferred that the thickness of the device body is substantially constant and is substantially flat. The contacting surfaces of the pole pieces or intermediate discs are also preferably flat and smooth in order to maintain the correct distribution of the compression force that is applied to the device body. Alloyed device topologies may be employed where a first side of an alloyed device body is permanently soldered, brazed or otherwise metallically bonded to a corresponding pole piece or intermediate disc. A floating pole piece or intermediate disc may contact the second side of the alloyed device. It may be necessary to insert a ductile metal sheet or foil between the floating pole piece or intermediate disc and the second side of the device body in order to maintain the correct distribution of the compression force. Such a ductile metal sheet or foil can also be inserted between either or both of the pole pieces or intermediate discs and the device body for a fully-floating type.

The pole pieces may be adapted to carry gate control signals to the device body by any convenient means, subject to the proviso that the gate control signal conductors shall not perturb the pole piece surface profiling in a manner that would adversely influence the electric field between pole piece and device body or between the pole pieces themselves. The industry standard method of machining a slot in the surface of the cathode side pole piece to accommodate a gate lead is not considered to be applicable to the present invention without significant modification to allow the gate lead to pass through a fully enclosed passage in the pole piece in the region where the gate lead and an otherwise open recess would interfere with the desired electric field control profiling. One suitable means of making gating connections is to route them through enclosed passages within the pole piece.

The pole pieces may be adapted to have a surrounding finned heat exchanger (e.g. radial cooling fins) providing the fins are sufficiently separated from the regions within the dielectric liquid that have the greatest electric field strength. In practice, as long as the distance between fins of adjacent pole pieces is significantly greater than the maximum likely diameter of entrained gas bubbles, the dielectric strength of common dielectric liquids will be more than sufficient to support the working voltage of the device. Movement of the dielectric liquid past the immersed power electronic devices will suppress and flush discharge sites clear of the regions of highest field strength and will oppose the formation of larger gas bubbles. The surfaces of the pole pieces may be textured by any convenient process so as to enhance their surface area or to beneficially influence the boundary layer flow with the dielectric liquid and heat exchange behaviour. The pole pieces provide compressive compliance, thermal and electrical connections but additionally provide a short thermal conducting path between the device body and a large wetted metallic heat exchange area. Heat generated during the operation of the device can therefore be efficiently transferred into the dielectric liquid that surrounds the device body.

When the pole pieces are adapted to have a surrounding finned heat exchanger the dielectric liquid may be selected to allow the heat exchangers to benefit from the phase change from liquid to vapour, thereby allowing a very high heat flux to be employed. If such phase change cooling is employed, the dielectric performance of the vapour phase and the fluid velocity must be taken into account when determining the separation distance between heat exchange surfaces of adjacent pole pieces.

The pole pieces may be adapted to have internal heat exchange passages and to be coupled to remotely sited heat exchangers using heat pipes. The remotely sited heat exchangers may be immersed in the same dielectric liquid as the pole piece or may employ any other coolant, subject to the inherent requirement to have an isolation voltage that is equivalent to that of the device.

The device may be used to construct a stack assembly of the sort described in EP 2161745. The stack assembly may be housed or 'canned' in a suitable enclosure which may form part of an electrical machine such as a motor or generator, for example. The stack assemblies may be housed in combination with other equipment so as to benefit from immersion in a common dielectric liquid. A single stack assembly may contain any desired combination of devices, subject to them all being suitable for the same contact compression force that is used to hold the devices and pole pieces in compression.

The device may also have a press pack construction where the device body, pole pieces and passivation means are located within a hermetically sealed housing that is backfilled with dielectric liquid. Such a device with press pack construction could also be used as part of a stack assembly.

BRIEF DESCRIPTION OF THE DRAWINGS

Exemplary embodiments of the invention will now be described, with reference to the accompanying drawings, in which.

DETAILED DESCRIPTION OF THE PREFERRED EMBODIMENTS

A first embodiment of the present invention will now be described with reference to FIGS. 6 to 10.

Figure 6:
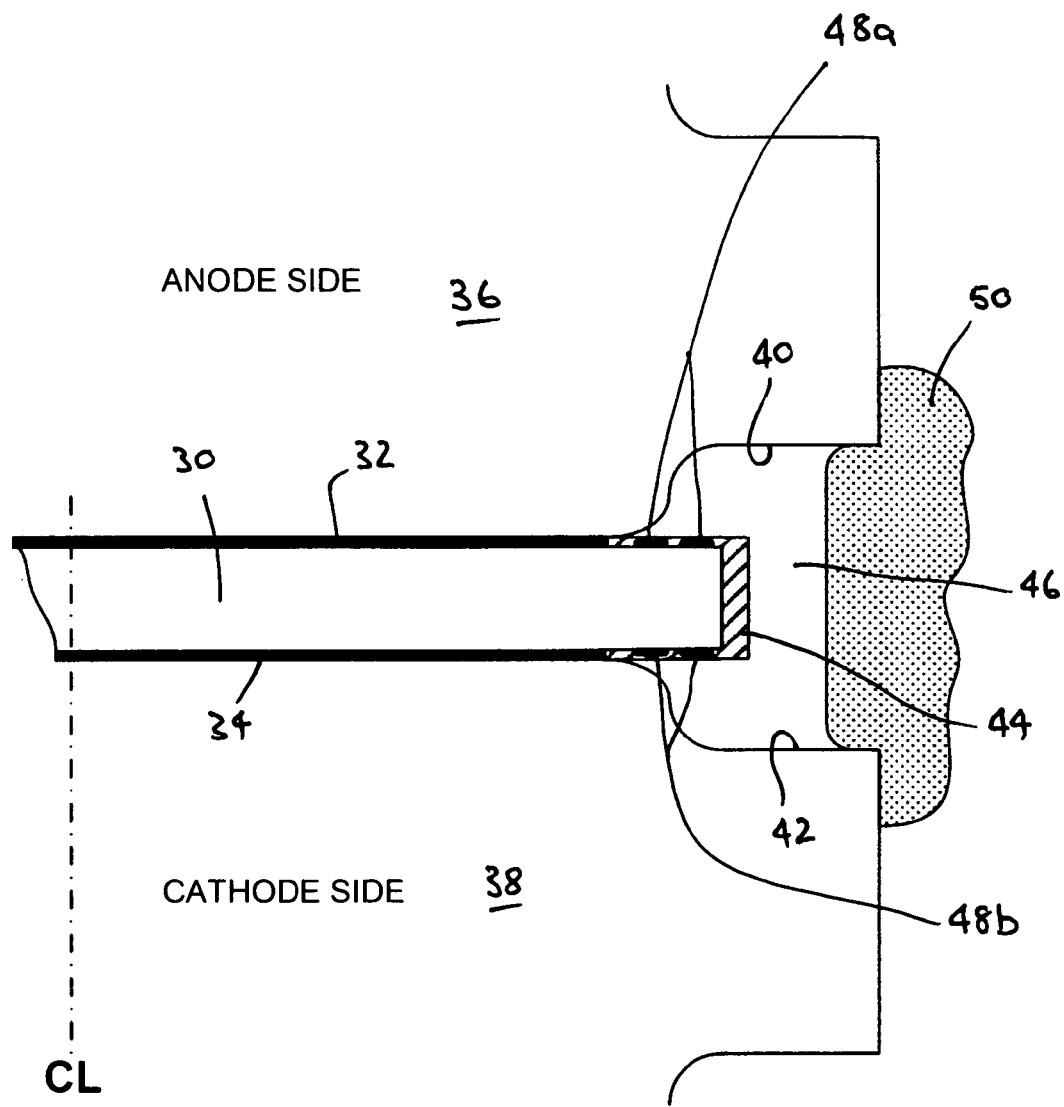
FIG. 6 is a partial cross section of a power electronic device according to a first embodiment of the present invention.

FIG. 6 shows a power electronic device having a semiconductor body (or wafer 30) which may be formed from a wide bandgap material such as diamond. The wafer 30 has anode side and cathode side metallised contact regions 32, 34 and is compressed between anode side and cathode side pole pieces 36, 38. A high voltage may be applied between the copper pole pieces, in turn being applied across the y axis of the wafer 30. The annular facing surfaces 40, 42 at the radial periphery of the pole pieces are deliberately shaped or profiled to influence the electric field as it emerges from the wafer 30. The surface profiles applied to the anode and cathode side pole pieces 36, 38 do not have to be identical. In practice, the respective surface profiles may be adapted to suit the individual and combined field control requirements of the anode and cathode sides of the power electronic device as discussed above.

As the electric field emerges from the wafer it enters a first layer of passivation material 44. The first layer 44 can be made of a glassy material, a ceramic material or a crystalline material which is deposited on the semiconductor body 30 as a slurry and then fired or chemically processed. An oxidation process can be used if the first layer 44 is made of an oxide material or composite. If the first layer 44 is made of an organic material such as rigid resin forms of polyimide or polyamide then it may be deposited on the semiconductor body 2 as a liquid and cured in situ. The exact type of the passivation material and the method by which it is applied to the semiconductor body 30 is not critical to the present invention and will be considered to be part of the design and manufacturing process of the semiconductor body. However, there is an overriding requirement that the passivation material be substantially void-free and that the finished surface of the first layer 44 of passivation material is sufficiently thin to permit a second layer 46 of passivation material to fill a space between the profiled surface 40, 42 of each pole piece and the external surface of the first layer of passivation material in a substantially void-free manner. If field control electrodes or guard rings 48a, 48b are provided adjacent the anode and/or cathode side contact metallisation regions 32, 34 then the first layer 44 of passivation preferably envelops them as shown most clearly in FIGS. 7A and 7B irrespective of whether they are recessed within, or deposited on, the semiconductor body 30.

A second layer 46 of passivation material is provided radially and axially outside the first layer 44. The second layer 46 of passivation material may be formed by vacuum impregnation moulding of a suitable elastomeric dielectric material in situ over the first layer 44 of passivation material. The preferred passivation materials are commercially available high performance electrical grades of silicone rubber. It is necessary to substantially exclude air from the interfaces between the pole pieces 36, 38 and the second layer 46 of passivation material, to substantially exclude air from the bulk of the second layer of passivation material itself, and to substantially exclude air from the interface between the first and second layers of passivation material. It is also necessary to substantially exclude any ingress of passivation material to the electrical and thermal interfaces between the pole pieces 36, 38 and the contact metallisation regions 32, 34 of the semiconductor body that is surrounded by the passivation layers.

The power electronic device is immersed in a dielectric liquid 50 that surrounds the second layer 46 of passivation material. MIDEL 7137 is a commercially-available synthetic replacement for mineral transformer oil with excellent dielectric and environmental properties and is particularly well suited to use in the present invention. However, other dielectric liquids, including those with boiling points in the range 50 to 100° C. with potential for use in phase-change cooling, can be used.

The wafer 30 is shown having two deposited type anode side field control electrodes 48a and two deposited type cathode side field control electrodes 48b that are employed to locally short out the electric field as it emerges from the wafer and enters the first layer 44 of passivation material. Any applicable number, size and type of field control electrodes may be used for the purpose of diffusing the electric field as it emerges from the wafer 30 to an extent where voltage breakdown of the passivation material is improbable and field control electrodes may be present on anode and cathode side faces of the wafer.

Figure 7A:
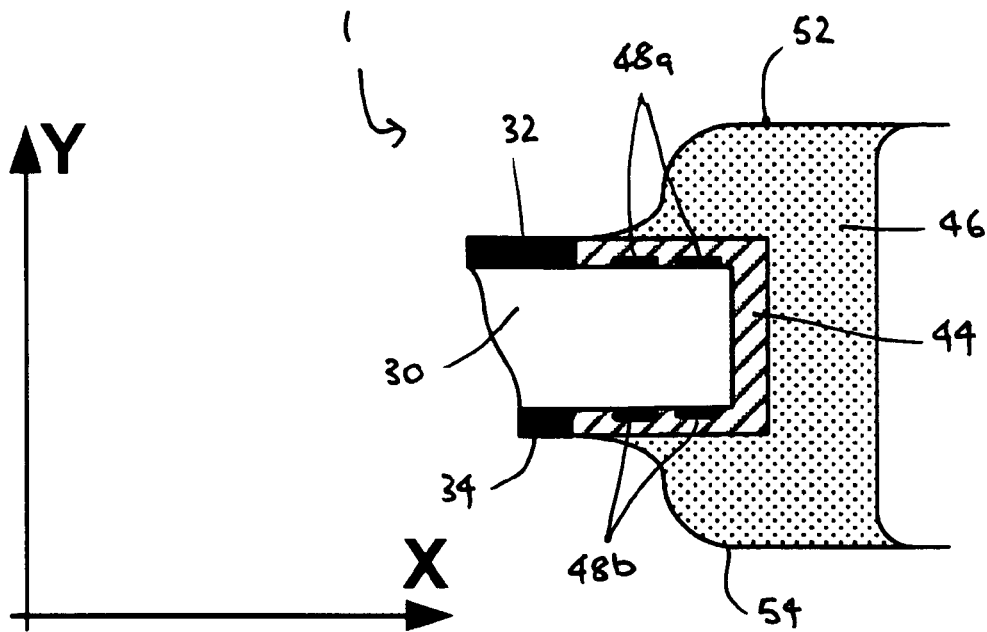
FIGS. 7A and 7B are a partial cross sections of 'basic units' that can be used to form the power electronic device of FIG. 6 and where the 'basic units' are formed by two alternative manufacturing processes.
Figure 7B:
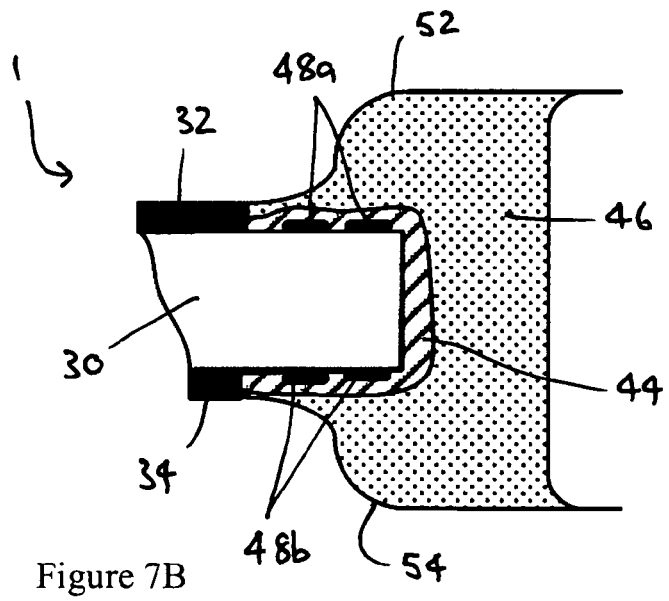

Because the wafer 30 is very thin, flexible and strong, the pole pieces 36, 38 can apply a compression force directly against the contact metallisation 32, 34. The dimensions of the wafer 30 in the x axis are typically constrained to correspond with those of the pole piece, i.e. the wafer is expected to withstand the effects of differential thermal expansion. FIGS. 7A and 7B shows the result of two alternative processing methods that permit the second layer 46 of passivation material to fill the space between the first layer 44 of passivation material and the profiled surfaces 40, 42 of the pole pieces 36, 38. These processing methods are described in more detail below. In FIG. 7A the first layer 44 of passivation material is depicted having a thickness and location in the y axis such that its outer parallel flat surfaces are aligned with the outer parallel flat surfaces of the contact metallisation regions 32, 34. This allows the space between the profiled surfaces 40, 42 of the pole pieces 36, 38 and the first layer 44 of passivation material to be free of geometric discontinuities and hence to have maximum beneficial effect upon electric field distribution in this space. The first layer 44 of passivation material is also depicted as being continuous up to its interfaces with the contact metallisation regions 32, 34 for the same reason. The thickness matching of the first layer 44 of passivation material with the outside dimension of the contact metallisation regions 32, 24 and the continuity of the first layer of passivation material up to its interfaces with the contact metallisation regions may be achieved by any means and grinding is a preferred production method. Another process is to deposit or grow the first layer 44 of passivation material with precise control so that its thickness is at least sufficient to satisfy electrical, chemical and mechanical requirements, but so it does not exceed the thickness that would cause an interference fit between the first layer of passivation material and the pole piece surfaces 40, 42. The result of such a process is shown in FIG. 7B. The first layer 44 of passivation material may be deposited or grown on the wafer 30 by any suitable means in order to achieve the desired geometry.

Whichever process is used to provide the first layer 44 of passivation material then the thickness of the first layer of passivation material need only be sufficient to ensure chemical stability of the underlying wafer 30 as long as the second layer 46 of passivation material and the interface between the first and second layers of passivation material are able to withstand the applied electrical field without breaking down. This might be achieved by a thickness of less than 1 mm in both the x and y axes, for example. In practice the design of the anode and cathode side field control electrodes 48a, 48b will normally be such that the dielectric capability of the first layer of passivation material and its interfaces are not exceeded.

It is generally preferable that there is a space between the outer surface of the first layer 44 of passivation material and the pole pieces surfaces 40, 42 so that the second layer 46 of passivation material can fill this space and be compressed as described below.

The power electronic device shown in FIG. 6 includes pole pieces 36, 38. A 'basic unit' 1 without the pole pieces will now be described in more detail with reference to FIGS. 7A and 7B.

The basic unit 1 is a self-contained assembly that can be inserted between pole pieces in order to produce a single power electronic device or inserted between adjacent pairs of pole pieces to produce a complete stack of such devices. The basic unit 1 can be manufactured and held in store in a protective environment until it is appropriate to assemble it with other parts prior to being immersed in a dielectric gas or liquid during use. Because the second layer 46 of passivation material is an elastomeric material it provides a degree of mechanical protection for the relatively fragile wafer 30 and a degree of environmental protection may be achieved by storing the basic unit 1 immersed in a dielectric liquid or in dry nitrogen, for example.

The second layer 46 of passivation material has external annular surface profiles 52, 54 which correspond to the surface profiles of the adjacent pole pieces. The basic unit 1 will normally be assembled between the pole pieces in an environment of clean ambient air but other environments, e.g. dry nitrogen or even a dielectric liquid, could be used. When assembled the respective surface profiles of the second layer 46 of passivation material and the pole pieces ensure that there is substantially void-free interface between them.

Figure 8:
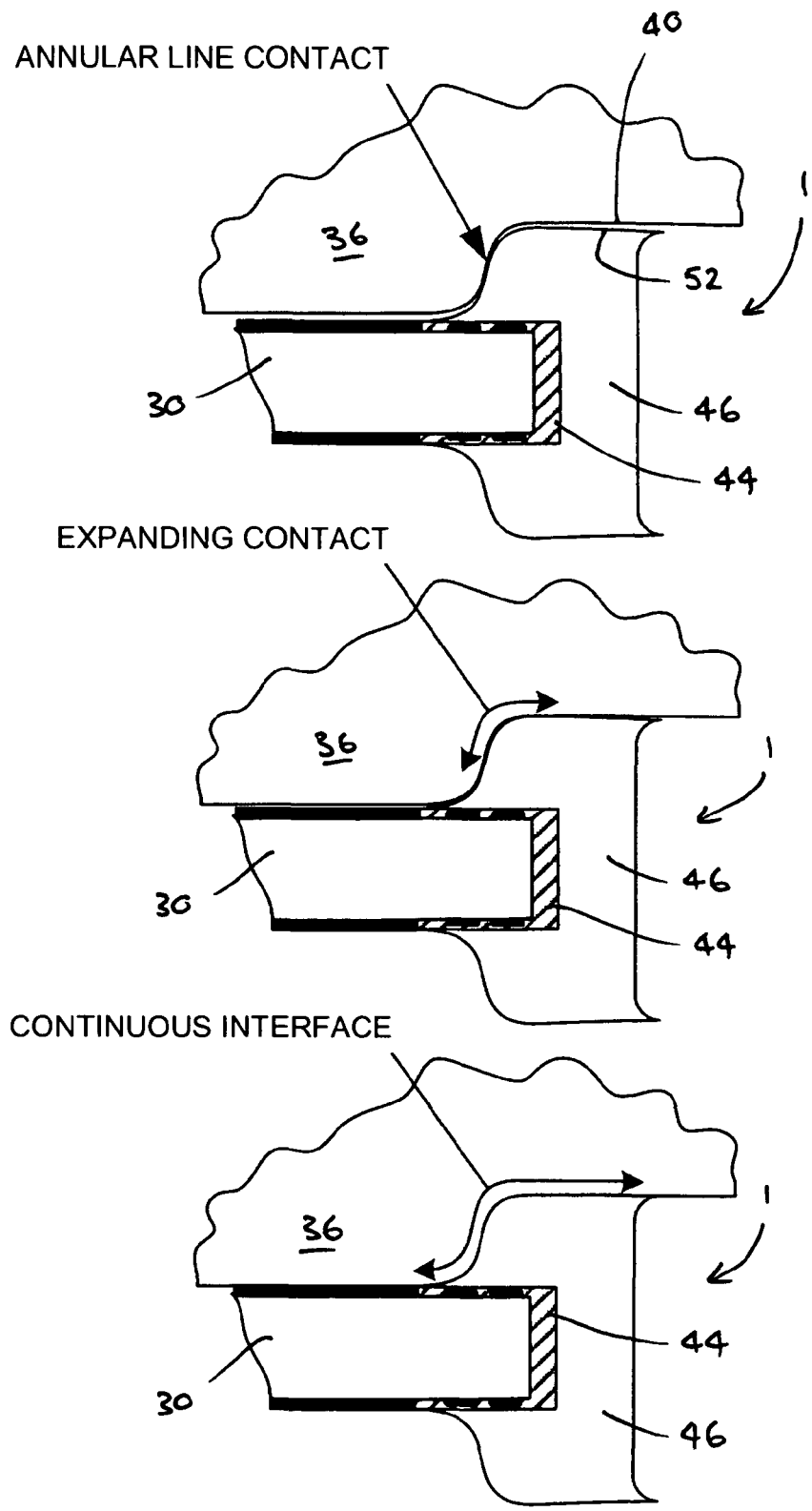
FIG. 8 is a partial cross section showing a sequence of assembling the 'basic unit' of FIG. 7A between a pair of pole pieces.

FIG. 8 shows a typical process by which a basic unit 1 can be assembled to form a power electronic device, but only the anode pole piece 36 is shown for reasons of clarity. The basic unit 1 and the pole pieces are aligned by any convenient means and then progressively moved towards one another in an axial direction (corresponding with the y axis). More particularly, it will be appreciated that the anode side pole piece 36 moves towards the basic unit 1 in a first axial direction and the cathode side pole piece 38 moves towards the basic unit in a second, opposite, axial direction. Initial contact establishes an annular line contact between the second layer 46 of passivation material and the profiled surface of each pole piece. As the parts are brought closer together and the elastomeric material of the second layer 46 is compressed between the pole pieces then the line contact area with each pole piece expands radially as shown schematically by the arrow. The progressive compression of the elastomeric material causes air (or any other assembly environment gas or liquid) to be extruded radially outwards and radially inwards from the expanding contact area between each pole piece and the second layer 46 of passivation material. Radial outward air flow is vented directly to the surrounding atmosphere. Radial inward air flow may be vented to the surrounding atmosphere through a suitable internal vent (not shown) within the pole pieces. When a central gate contact recess and associated passage to the exterior is provided in a pole piece then internal venting can be by this means. Alternatively, internal venting may be avoided and any compressed air that is not vented externally as a result of leakage through surface imperfections or deformation of the second layer 46 of passivation material may remain within the spaces between asperities or other cavities in the contacting surfaces. It should be noted that such compressed air will have minimal influence upon the thermal and electrical contact performance. A stable gas such as dry nitrogen may replace ambient air during the assembly process if this is considered to be advisable. If a dielectric liquid is used during the assembly process then a small quantity of the dielectric liquid may be admitted during the assembly process, it being vented externally as a result of leakage through surface imperfections or deformation of the second layer of passivation material. It must be noted, however, that significant pressure may be developed within the dielectric liquid in the spaces between pole pieces and the adjacent metallised contact regions as a result of the incompressible nature of the dielectric liquid, and that this pressure will be sufficient to overcome the sealing between the second layer 46 of passivation material and the pole pieces, thereby allowing the dielectric liquid to flow through the interface between the second layer of passivation material and the associated pole piece. In other words, the system is intentionally vented in this manner. It is acceptable for small amounts of dielectric liquid to remain in any voids that may be present in the interface between the second layer 46 of the passivation means and the associated pole piece. The presence of a dielectric liquid in the compressed electrical and thermal interface between contact metallisation and the pole piece is analogous to the case where oils are used during the compression assembly of press pack type pole pieces and their associated heatsinks where it is known that the oil harmlessly extrudes or vents through the spaces between mating metallic surface asperities and thereby does not harmfully effect the performance of the compressed interface.

Figure 9:
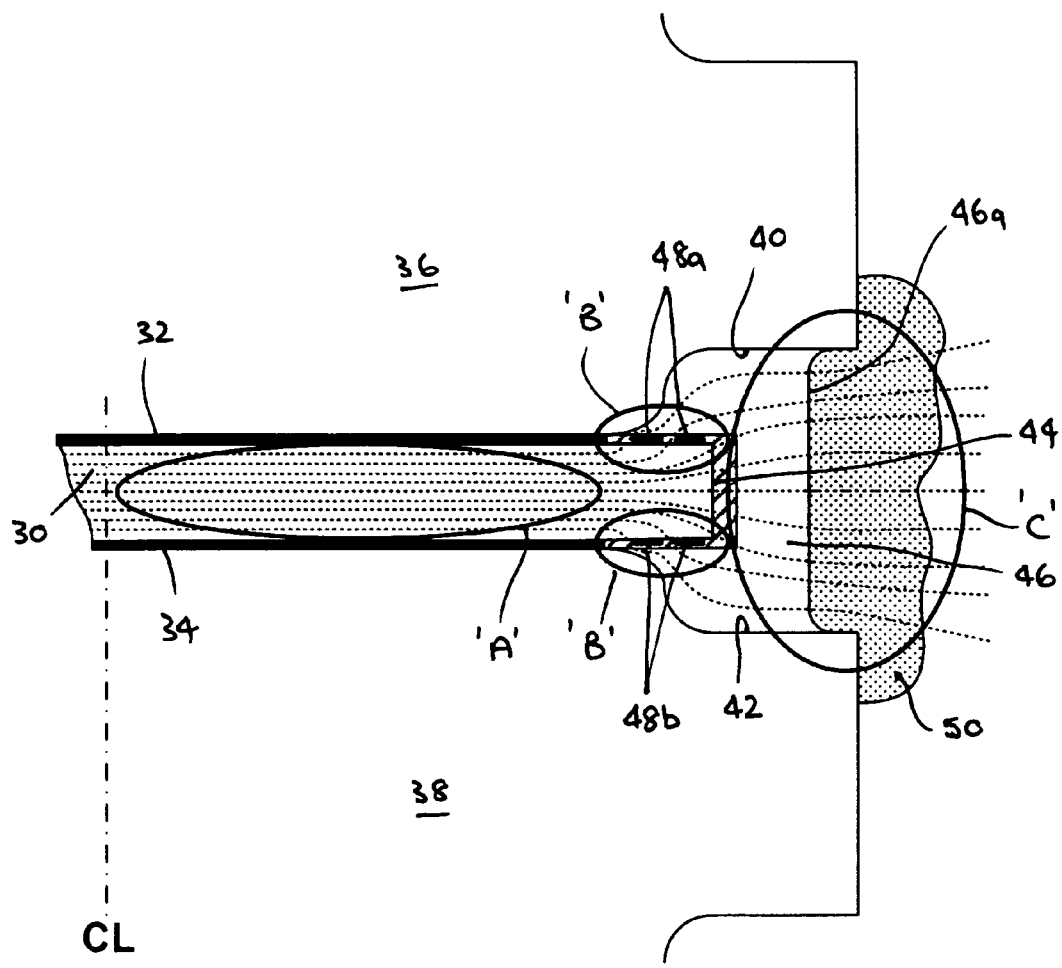
FIG. 9 is a partial cross section of the power electronic device of FIG. 6 highlighting the various field control regions.

FIG. 9 shows how the electric field is controlled in different regions of the power electronic device. A number of dotted lines represent contours of constant voltage, the electric field being perpendicular to the dotted lines and of a magnitude that is approximately inversely proportional to the separation distance between the dotted lines. The electric field is rotationally symmetrical about the device centre line CL. In the interest of clarity, the depiction of the electric field has been simplified and approximated. The mechanisms that control the electric field in four regions of the power electronic device are now described.

Central region A is dominated by the physics of the power electronic device itself. The skilled person will have a full understanding of such physics and for the present purposes it is sufficient simply to appreciate that the mean electric field strength within the wafer 30 may be considerably in excess of the electric field strength that the passivation materials can withstand. Moreover, the electric field strength within the wafer 30 may not be uniform throughout the thickness of the wafer and it is commonplace for the electric field strength to be modulated according to the operating mode of the device. For example, a four layer pnpn thyristor structure has three nominal operating modes; forward blocking, reverse blocking and conducting. During forward blocking the electric field tends to be concentrated in the cathode side of the wafer.

During reverse blocking the electric field tends to be concentrated in the anode side of the wafer. During conduction the electric field is insignificant in the context of the present invention. Nevertheless, it is also possible that future power electronic devices may have an almost uniform electric field strength throughout the thickness of the wafer.

Field control electrodes and pole piece profiles dominate in edge regions B. It will be readily appreciated that the number, width, spacing and topology of field control electrodes 48a, 48b may be adjusted to satisfy the operational requirements of the device. Moreover, the field control electrode geometry may be non-uniform and asymmetrical. For example, anode side contact metallisation may extend to the outside edge of the wafer whilst field control electrodes may only be employed on the cathode side of the wafer. The pole piece profiles 40, 42 and the matching profiles of the contacting surfaces 52, 54 of the second layer 46 of passivation material need not be identical but for convenience a symmetrical arrangement is shown in FIGS. 6 to 10.

Figure 1:
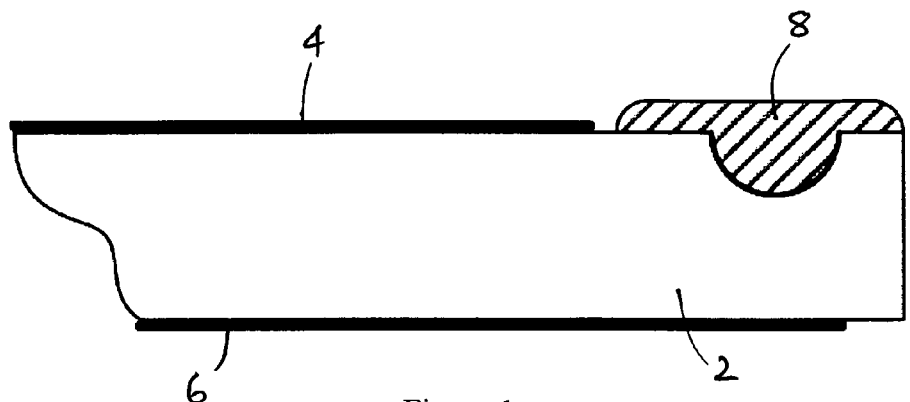
FIG. 1 is a partial cross section showing a conventional moat groove bevel applied to the semiconductor wafer of a power electronic device.
Figure 2:
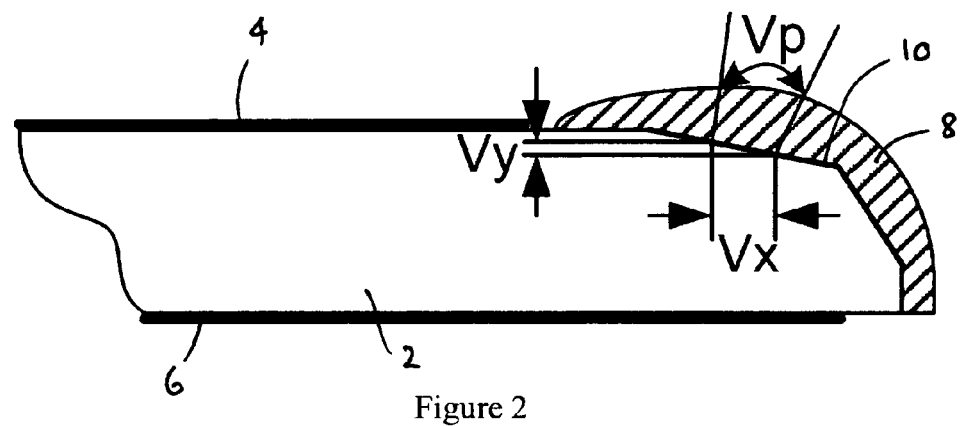
FIG. 2 is a partial cross section showing a conventional conical bevel applied to the semiconductor wafer of a power electronic device.
Figure 3:
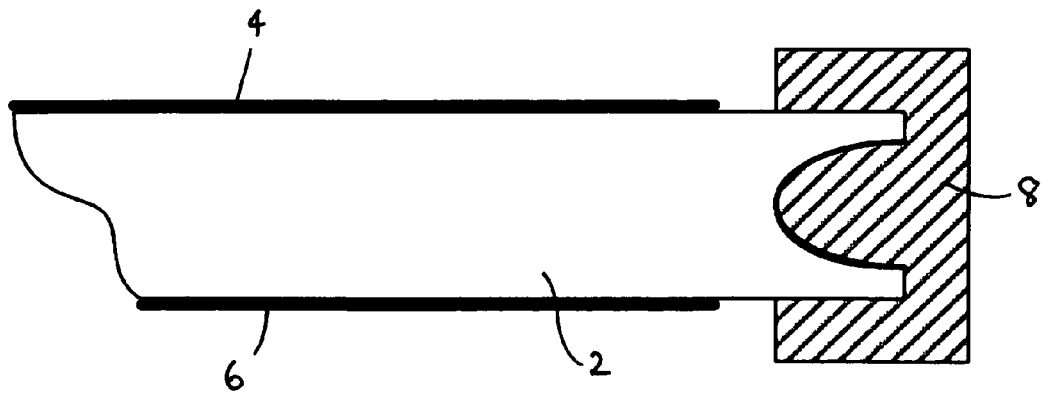
FIG. 3 is a partial cross section showing a conventional pulley wheel bevel applied to the semiconductor wafer of a power electronic device.
Figure 4:
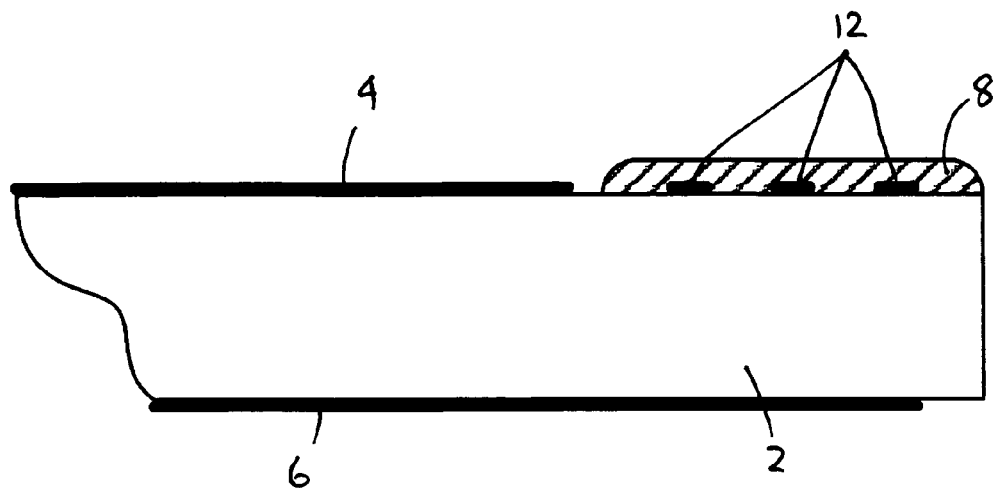
FIG. 4 is a partial cross section showing a series of conventional deposited guard rings applied to the semiconductor wafer of a power electronic device.
Figure 5:
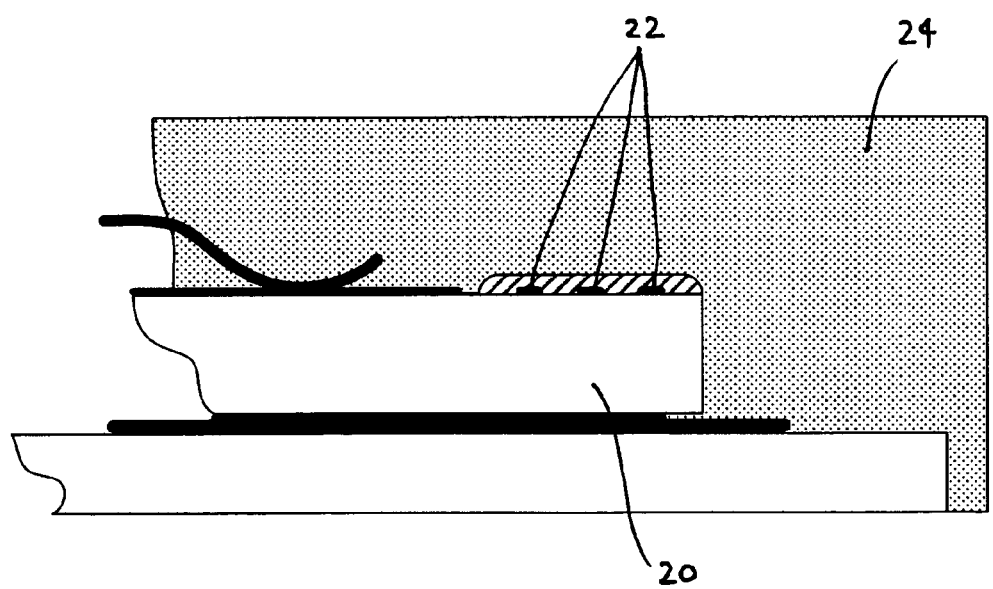
FIG. 5 is a partial cross section showing a conventional IGBT die structure applied to an insulated power module with an earthed base plate.

The electric field emerges from the wafer 30 between adjacent field control electrodes 48a, 48b. The electric field that appears across the surface of any single field control electrode is minimal because the field control electrodes have low electrical resistivity or are preferably electrically conductive. In the present invention, the emergence of electric field between adjacent field control electrodes is strongly and beneficially influenced by the proximity of field control electrodes and pole piece profiles, whereas in prior art devices, for example an IGBT module as shown in FIG. 5, no pole piece profile of the specified type is present near the anode side (more commonly known as the collector) and this region has a number of undesirable, but tolerable in the context of a device with a relative low voltage rating, electrode and dielectric discontinuities associated with the soldered interface of the die to a copper track on an insulation substrate which is soldered to an earthed baseplate. Field control electrodes (more commonly known as guard rings) are provided on the cathode side (more commonly known as the emitter) but no cathode terminal interconnections or electrodes or conductive profiled materials are located in proximity with the field control electrodes. One distinguishing feature between the present invention and the prior art is the proximity of an additional field controlling electrode, i.e. the pole piece profile that is not aligned with, or in the same plane as, the on-wafer field control electrodes. The pole piece profiles 40, 42 and field control electrodes 48a, 48b together form a multi-electrode array.

The electric field diffusion within edge region B is controlled by the geometry of the multi-electrode array in conjunction with the dielectric and resistive behaviour of the materials that must withstand the electric field. DC electric field diffusion is dependent upon the volume resistivities of the materials within the array. Very low frequency AC electric field diffusion is dependent upon the resistivities and space charge capacities of the materials within the array, and higher frequency AC electric field diffusion is dependent upon the dielectric constant of the materials within the array. The frequency response of such an insulation system is complex but since the effective RC time constants of the dielectric type passivation materials are far greater than the period of typical switching frequencies, the AC and DC electric fields are effectively superimposed upon one another. The presence of pole piece profiles 40, 42 in the vicinity of otherwise conventional field control electrodes 48a, 48b provides the power electronic device designer with new and important flexibility in edge termination design.

The electric field diffusion within region C is primarily controlled by the geometry of the surface profiles 40, 42 of the adjacent pole pieces 36, 38 in conjunction with the dielectric and resistive behaviour of the passivation materials that must withstand the electric field, although the field control electrodes of the above described multi-electrode array may exert some influence. The field diffusion within region C is sufficient to reduce the electric field that is experienced across the external surface of the second layer 46 of passivation material to be sufficiently low to practically eliminate the possibility of extensive or catastrophic surface breakdown. The radially outer surface 46a of the second layer of passivation material is exposed to the surrounding dielectric liquid 50 and this aspect of the insulation behaviour within region C will now be further described with reference to FIG. 10 which is an expanded derivative of FIG. 9.

Figure 10:
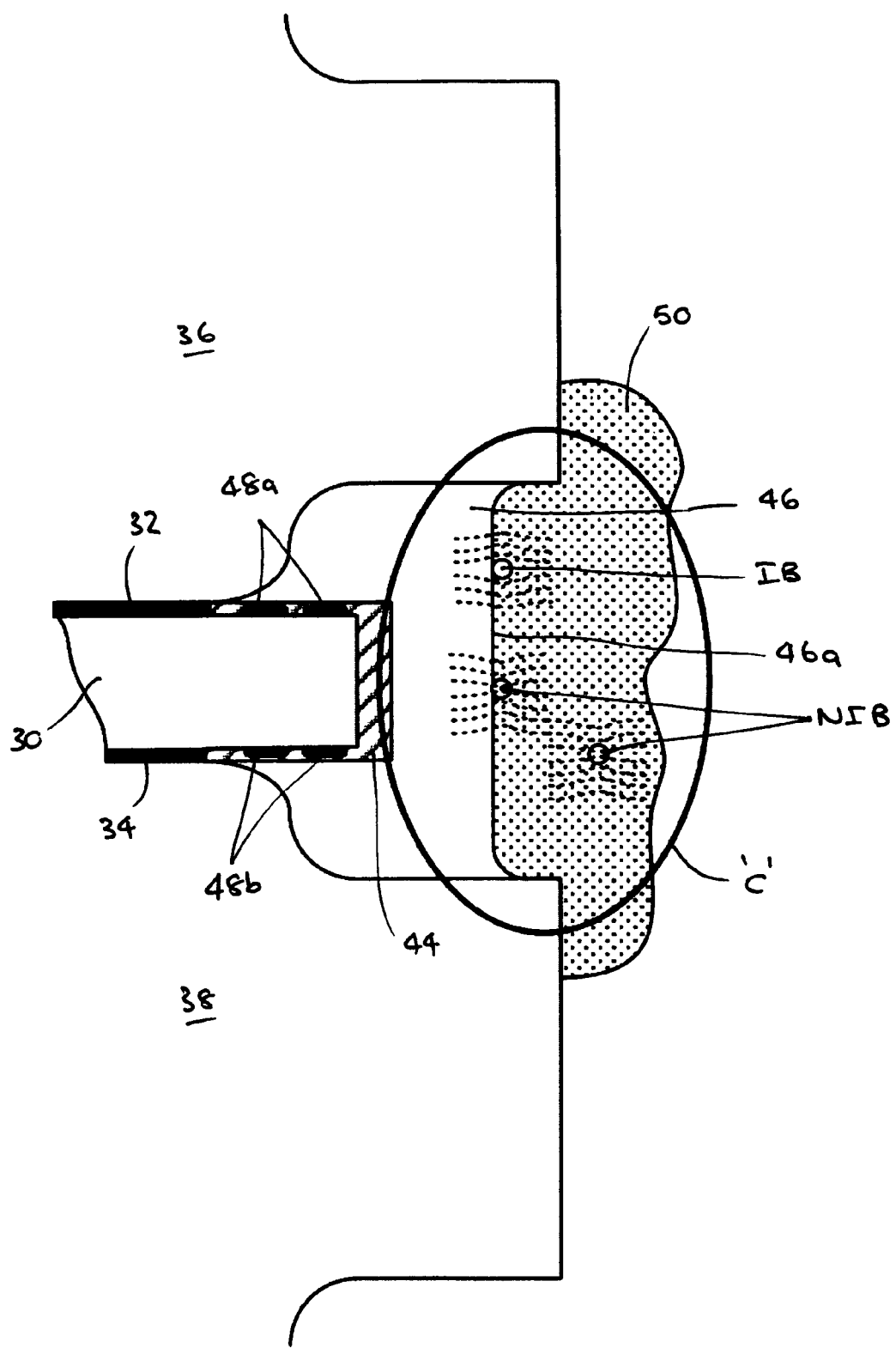
FIG. 10 is a partial cross section of the power electronic device of FIG. 6 showing the presence of gas bubbles.

FIG. 10 shows the effect of the presence of gas bubbles or other potential causes of partial discharge within the dielectric liquid 50 on the electric field in the dielectric liquid that surrounds the second layer 46 of passivation material, and more particularly at the interface between the dielectric liquid and the radially outer surface 46a of the second layer of passivation material.

The designed diffusion of the electric field must take into account the insulation capability of the dielectric liquid 50 and more particularly its worst case in service conditions. It may be taken for granted that the materials that would be used in a high voltage insulation system would be processed with appropriate quality controls. Nevertheless materials would in practice be subject to significant performance tolerances and imperfections. Reasonable measures must be taken to maintain the quality of the dielectric liquid 50 in service such as continuous out-gassing, filtration and drying, for example, but even so controlled imperfections are still to be expected. In large force circulated cooling systems, whether or not the forced circulation is associated with providing a cooling function or simply to maintain insulation and electric field control performance, gas bubbles will inevitably be present in the dielectric liquid 50 and their effects must be accommodated in the design.

Three example bubble locations are depicted.

Non-ionised gas bubbles NIB will distort the electric field in a way that reduces the electric field elsewhere. However, the voltage breakdown capability of gas bubbles will be less than that of the dielectric liquid 50 and ionisation is a likely occurrence. An ionised gas bubble IB will cause partial discharge to occur in the gas bubble and this will distort the electric field in a way that increases the electric field elsewhere, potentially causing a catastrophic cascade breakdown failure. The risk of breakdown is greatest when a bubble adheres to the radially outer surface 46a of the second layer of passivation material because the solid material may be damaged by the sustained localised heating that is associated with repetitive partial discharge sites. Repetitive discharges in a fixed location may cause carbonisation of the radially outer surface 46a of the second layer of passivation material to occur and this will permanently increase the electric field elsewhere on the surface as a result of the electrical conductivity of the carbonised material. The dielectric liquid 50 may be force circulated firstly to flush discharge sites away so sustained local heating does not occur and secondly to enhance cooling of the radially outer surface 46a of the second layer of passivation material.

Discharges may also occur within the bulk of the dielectric liquid 50 but this is a less serious problem than in the case of a bubble that has adhered to the radially outer surface 46a of the second layer of passivation material because the passivation material is not directly affected by the discharge. Nevertheless, discharges in the dielectric liquid 50 are undesirable because they cause carbonisation to occur and provision must be made to filter discharge by-products from the dielectric liquid. In practice, the applicable dielectric liquids are specially formulated to discourage partial discharge and to minimise the consequences of partial discharge.

In some systems it may be possible to completely out-gas the dielectric liquid 50 thereby avoiding the possibility of partial discharge. In other systems, the gas may have known and acceptable dielectric properties and may be an intentional feature of the design, for example where the dielectric liquid is used to provide phase change cooling.

The present invention has been described so far in the context of power electronic devices that need only have only two power terminals, e.g. diodes. However the present invention is equally applicable to devices having two power terminals and any number of control terminals. For example, a conventional thyristor will typically have two power terminals, a gate terminal and an auxiliary cathode terminal to allow it to be connected to an external low inductance gating circuit. In general terms the control terminal(s) will operate at relative low power and voltage compared with the anode and cathode power terminals. This means that each control terminal will be provided with a suitable passage through the respective pole piece in a manner that minimises the working voltage between the interconnections to external control circuits and the surrounding pole piece. Such passages should not interfere with the function of the pole piece surface profiles and it is therefore necessary to bury such passages within the pole pieces. Any convenient means may be employed to facilitate such interconnections, for example drilled passages may be provided to allow a circular coaxial cable to be threaded through a pole piece, but other conductor systems such as striplines would entail the use of other manufacturing processes.

Any suitable means may be employed for making control terminal connections to wafer and these may be housed within the pole piece. Common practice would be to employ spring pressurised contacts that bear upon dedicated metallised areas of the wafer.

Any suitable means may be employed to allow removal of heat from the pole pieces and any number of power electronic devices may be assembled either as a stack or as a single device. Cooling fins (not shown) of any type may surround the pole pieces. The flow of the dielectric liquid may be directed in any axis but it is preferred to direct the flow to be parallel to the centre line axis of the single device or stack because this avoids the issue of stagnation when a crossflow system is employed (stagnation may increase the risk of gas bubble adhesion to the radially outer surface of the second layer of passivation material. The dielectric liquid may be selected to allow phase change cooling of pole piece fins. Pole pieces may have suitable internal passages (not shown) to allow phase change cooling to be employed in conjunction with heat pipes to remotely located heat exchangers (condenser). The heat pipes may be simply embedded within the pole pieces in a manner that guarantees good thermal contact between pole piece and heat pipe, alternatively, the pole piece may have internal heat exchange passages that allow the working fluid (not the dielectric liquid) to vaporise within the pole piece, thereafter transferring heat via the heat pipe to the associated remotely sited condenser.

Figure 11:
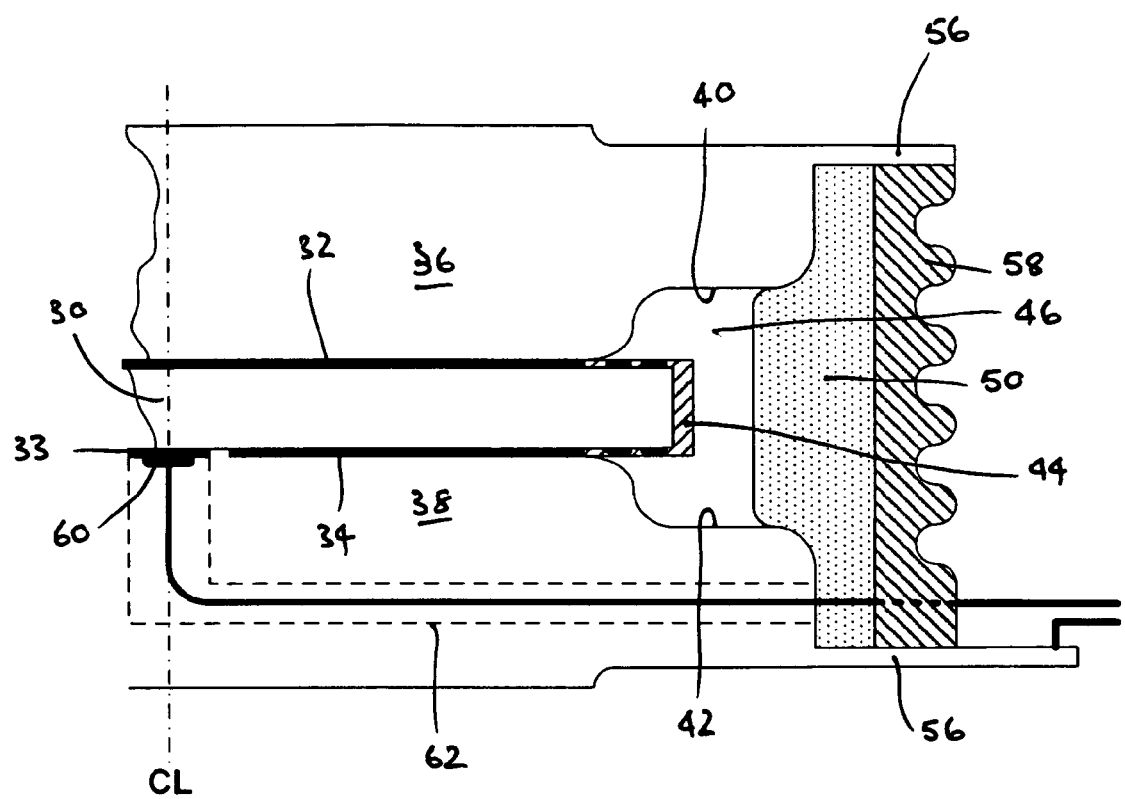
FIG. 11 is a partial cross section of a power electronic device according to a second embodiment of the present invention having a press pack configuration.

A second embodiment of the present invention will now be described with reference to FIG. 11. The second embodiment employs a press pack arrangement that may be derived from the basic units 1 shown in FIGS. 7A and 7B. Like parts have been given the same reference numerals.

The press pack arrangement is hermetically sealed by adapting pole pieces 36, 38 to include flanges 56 that are brazed to the corresponding metallised faces of an insulated housing 58. The profiling may be different on anode and cathode side pole pieces as previously described. The first region controls the electric field as previously described and the second region controls the electric field so as to allow its further diffusion into the insulated housing 58 through backfilled dielectric liquid 50. The dielectric liquid 50 may be backfilled by any convenient means and the conventional practice for dry nitrogen filling, followed by hermetic sealing using a port in the wall of the insulation housing 58 may be adapted for this purpose. It is important that the backfilled dielectric liquid 50 is substantially void-free and vacuum-pressure impregnation techniques may be adapted for this purpose.

Pole pieces 36, 38 may have conventional external contact faces applied by any convenient process. The insulation housing 58 may be of any suitable material and the conventional practice of using a glazed ceramic housing is particularly appropriate. The outside surface profile of the insulated housing 58 may include shedding as required to increase the length of the creepage path between pole pieces 36, 38 and over the surface of the shedding. The complete press pack housed device may itself be immersed in a dielectric liquid (not shown). Thermal expansion of the dielectric liquid 50 within the press pack housing may be accommodated by designing flanges to accept some flexure, but alternatively expansion devices may be provided either inside or outside the housing. One suitable internal technique is to include a flexible gas-filled bladder which may conveniently be ring shaped.

If a controlled switching device is required its control signals may be introduced through a suitable port in the insulation housing 58 and this may also be used to facilitate a conventional backfilling and hermetic sealing process. The control signals may be routed to a pressure contact 60 which bears upon a metallised contact region 33 on the wafer 30. A passage 62 may be provided to facilitate the control signal interconnection without interrupting pole piece profiles. The passage 62 may also be filled with substantially void-free dielectric liquid or may be filled with another suitable insulation material providing this insulation material is processed in a manner that is not prone to out-gassing or adverse reaction with the dielectric liquid in service. Flanges 56 may additionally be adapted to facilitate the connection of a cathode auxiliary signal by any suitable means. Alternatively, the cathode auxiliary signal may be coaxially around or coplanar with the gate signal and the cathode termination may be made with pole pieces 38 by any convenient means in a location adjacent to the pressure contact 60.

A third embodiment of the present invention will now be described with reference to FIGS. 12 and 13. In this embodiment anode and cathode side discs 64, 66 and the corresponding pole pieces 36, 38 are disposed or adapted so as to conform to desired field control principles. Two suitable means of conforming are depicted.

Figure 12:
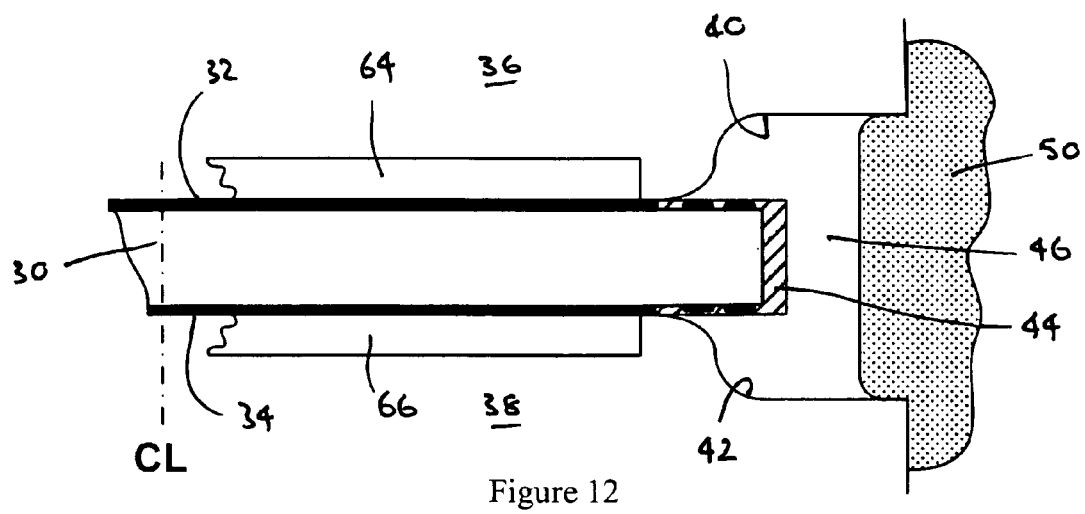
FIGS. 12 and 13 are partial cross sections of power electronic devices according to a third embodiment of the present invention where the anode and cathode side discs or plates and the corresponding pole pieces are disposed or adapted so as to conform to desired field control principles.

In FIG. 12 the anode and cathode side discs 64, 66 are set into corresponding recesses within pole pieces 36, 38 and the pole piece surface profiles 40, 42 are as described above. In FIG. 13 the anode and cathode side discs 64, 66 carry truncated portions 64a, 66a of the surface profiles while the pole pieces 36, 38 carry corresponding truncated portions 40a, 40b of the surface profiles. Similar anode and cathode side discs or plates may be used in a conventional fully housed press pack semiconductor device.

Figure 13:
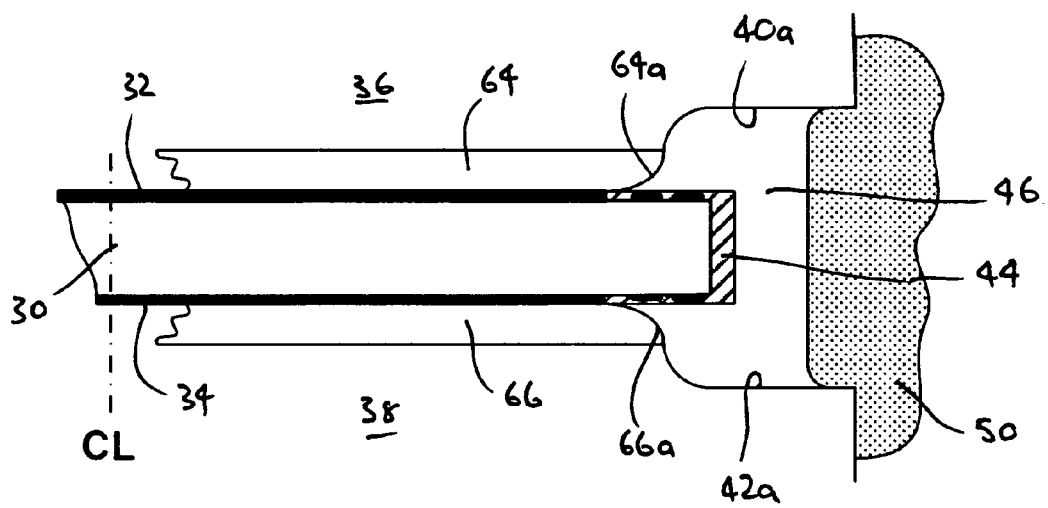

In the embodiment of FIG. 13 the profiled annular surfaces of the second layer 46 of passivation material forms an interface with the truncated portions 64a, 66a of the anode and cathode side discs or plates and it will be readily appreciated that the interface therefore need only be partly defined by the pole pieces 36, 38 in some situations.

The invention claimed is:

1. A high voltage device immersed in a liquid dielectric, the device comprising:
    a pair of pole pieces, each pole piece including a profiled surface at a peripheral edge region, the profiled surface of the pole pieces facing each other;
    a device body located between the pole pieces, the device body being subjected to an electric field and comprising:
        (i) a central current carrying region, and
        (ii) an edge termination region comprising a plurality of planar edge termination components configured to diffuse the electric field within the device body, the electric field emerging from the edge termination region of the device body, wherein the profiled surfaces of the pole pieces and the planar edge termination components together form a multi-electrode array; and
    passivation material comprising:
        (i) a first material part surrounding and in contact with the edge termination region of the device body and configured to envelope the planar edge termination components, and diffuse the electric field as it emerges from the edge termination region, and
        (ii) a second material part disposed outside the first material part, and configured to fill the space between the profiled surface of each pole piece and the external surface of the first material part, to provide an interface with the profiled surface of each pole piece and which further diffuses the electric field as it emerges from the first material part of the passivation means, a radially outer surface of the second part of the passivation material being in contact with the dielectric liquid;
    wherein the profiled surfaces and the planar edge termination components of the multi-electrode array control the diffusion of the electric field within the passivation material.

2. The device of claim 1, wherein the device body incorporates a wide bandgap electronic material.

3. The device of claim 1, further comprising a space between a space between the outer surface of the first material part of the passivation material and the profiled surface of each pole piece, which space is at least partially filled by the second material part of the passivation material.

4. The device of claim 1, wherein the second material part of the passivation material is formed from a compliant elastomeric material.

5. The device of claim 1, wherein the second material part of the passivation material is formed from a silicone rubber.

6. The device of claim 1, wherein the first material part of the passivation material is substantially void-free.

7. The device of claim 1, wherein the second material part of the passivation material is substantially void-free.

8. The device of claim 1, wherein the interface between the second material part of the passivation material and the profiled surface of each pole piece is substantially void-free.

9. The device of claim 1, wherein the part of each pole piece that is profiled lies radially outside a central region that faces the current carrying region of the device body.

10. The device of claim 9, wherein the transition between the central region and the peripheral edge region of each pole piece is at a region which faces substantially the radially inner side of the planar edge termination components of the device body.

11. The device of claim 1, wherein each pole piece includes a central region that is in contact with a respective contact metallisation region of the device body or with an intermediate disc.

12. The device of claim 1, wherein the profiled surfaces of the pole pieces are symmetrical.

13. The device of claim 1, wherein the profiled surfaces of the pole pieces are asymmetrical.

14. The device of claim 1, further comprising a pair of discs, each disc being in contact with a respective contact metallisation of the device body.

15. The device of claim 14, wherein each disc is located in a corresponding recess formed in a substantially flat part of the associated pole piece.

16. The device of claim 14, wherein each disc has a profiled surface and the second material part of the passivation material provides an interface with both the profiled surface of each pole piece and its associated disc.

17. The device of claim 1, wherein the surrounding dielectric liquid is substantially void-free.

18. The device of claim 1, wherein the pole pieces are adapted to have a surrounding finned head exchange.

19. The device of claim 1, further comprising a gate connection that is routed through a passage within a pole piece.

20. The device of claim 1, further comprising a press pack construction where the device body, pole pieces and passivation material are located within a hermetically sealed housing that is backfilled with dielectric liquid that is in contact with the radially outer surface of the second material part of the passivation material.

21. A stack assembly comprising at least one high voltage device immersed in a liquid dielectric, the device comprising:
    a pair of pole pieces, each pole piece including a profiled surface at a peripheral edge region, the profiled surface of the pole pieces facing each other;
    a device body located between the pole pieces, the device body being subjected to an electric field and comprising:
        (i) a central current carrying region, and
        (ii) an edge termination region comprising a plurality of planar edge termination components configured to diffuse the electric field within the device body, the electric field emerging from the edge termination region of the device body; wherein the profiled surfaces of the pole pieces and the planar edge termination components together form a multi-electrode array; and
    passivation material comprising:
        (i) a first material part surrounding and in contact with the edge termination region of the device body and configured to envelope the planar edge termination components, and diffuse the electric field as it emerges from the edge termination region, and
        (ii) a second material part disposed outside the first material part, and configured to the space between the profiled surface of each pole piece and the external surface of the first material part, to provide an interface with the profiled surface of each pole piece and which further diffuses the electric field as it emerges from the first material part of the passivation material, a radially outer surface of the second material part of the passivation material being in contact with the dielectric liquid;
    wherein the profiled surfaces and the planar edge termination components of the multi-electrode array control the diffusion of the electric field within the passivation material.

22. A method of operating a high voltage device immersed in a liquid dielectric, the device comprising:
  subjecting a device body located between pole pieces, each pole piece including a profiled surface at a peripheral edge region, the profiled surface of the pole pieces facing each other, to an electric field;
  diffusing, via an edge termination region of the device body comprising a plurality of planar edge termination components and the profiled surfaces, the electric field and emerging the electric field from the edge termination region of the device body; and
  diffusing the electric field by a passivation material having a first material part surrounding and in contact with the edge termination region of the device body and enveloping the planar edge termination components, as it emerges from the edge termination region and a second material part disposed outside the first material part filling the space between the profiled surface of each pole piece and the external surface of the first material part, providing an interface with the profiled surface of each pole piece, a radially outer surface of the second material part of the passivation material being in contact with the dielectric liquid; and
  wherein the dielectric liquid is circulated passed the immersed device in use.

* * * * *